(12) United States Patent
Ismail et al.

(10) Patent No.: US 8,485,772 B1
(45) Date of Patent: Jul. 16, 2013

(54) MEDIA FLIP AND CASSETTE EXCHANGE APPARATUS AND METHOD

(75) Inventors: Rosulan Bin Ismail, Butterworth (MY); Prakash Poobalan, Sungai Ara (MY); Robert M. Tierney, Fremont, CA (US); Safri Husin, Bayan Lepas (MY)

(73) Assignee: Western Digital Technologies, Inc., Irvine, CA (US)

( * ) Notice: Subject to any disclaimer, the term of this patent is extended or adjusted under 35 U.S.C. 154(b) by 564 days.

(21) Appl. No.: 12/711,985

(22) Filed: Feb. 24, 2010

(51) Int. Cl.
*B65G 65/00* (2006.01)
*B65G 47/08* (2006.01)
*B65G 47/52* (2006.01)

(52) U.S. Cl.
USPC ...... 414/416.08; 414/419; 414/810; 414/936; 414/938

(58) Field of Classification Search
USPC ....... 414/419, 416.08, 810, 936, 938; 134/33, 134/134
See application file for complete search history.

(56) References Cited

U.S. PATENT DOCUMENTS

| | | | | |
|---|---|---|---|---|
| 5,215,420 A | * | 6/1993 | Hughes et al. | 414/217 |
| 5,264,974 A | * | 11/1993 | Campbell et al. | 360/92.1 |
| 6,942,738 B1 | * | 9/2005 | Nelson et al. | 134/33 |
| 7,033,126 B2 | * | 4/2006 | Van Den Berg | 414/416.03 |
| 7,080,652 B2 | * | 7/2006 | Davis et al. | 134/133 |

* cited by examiner

*Primary Examiner* — Michael Scott Lowe

(57) ABSTRACT

An apparatus for arranging disks in a processing cassette includes a first conveyor configured to transfer a shipping cassette containing a plurality of disks to a first position and a comb assembly configured to displace one or more of the plurality of disks from the shipping cassette in the first position. A mandrel assembly is configured to remove the one or more displaced disks from the comb assembly and a turntable assembly is configured to rotate the comb assembly and the shipping cassette from the first position to a second position. The mandrel assembly is further configured to return the one or more displaced disks to the comb assembly and the comb assembly is further configured to replace the one or more displaced disks in the shipping cassette in the second position. A second conveyor is configured to transfer a processing cassette to a load position and the mandrel assembly is further configured to remove the plurality of disks from the shipping cassette in the second position and to load the plurality of disks into the processing cassette in the load position.

20 Claims, 14 Drawing Sheets

MEDIA FLIP AND CASSETTE EXCHANGE APPARATUS AND METHOD

FIELD

The present disclosure generally concerns the process of manufacturing hard drive media and, in particular, an apparatus and method for flipping the media and exchanging cassettes holding the media.

BACKGROUND

Hard drive media are manufactured by sputtering thin films of magnetic material on disks. The magnetic material allows data to be stored on the media and read from the media using a magnetic read/write head. Hard drive media can be either single-sided, where magnetic material is sputtered on a single side of each disk, or double-sided, where magnetic material is sputtered on both sides of each disk.

Typically, disks are manufactured and prepared for sputtering on a manufacturing line separate from the manufacturing line used to sputter the magnetic material. The disks are transported from one manufacturing line to the next using a shipping cassette designed to hold and protect multiple disks during transport. Once the shipping cassette arrives at the sputtering manufacturing line, the disks are removed from the shipping cassette and placed in a processing cassette designed to carry the disks through the sputtering manufacturing line. The process of exchanging the cassettes carrying disks as they transition from one manufacturing line to the next can create a bottleneck that slows the overall throughput of the manufacturing process.

SUMMARY

The subject technology provides an automated machine configured to quickly and efficiently transfer disks from a shipping cassette to a processing cassette. The machine is configured to place the disks in a proper orientation within the processing cassette for subsequent sputter processing.

According to one aspect of the present disclosure, an apparatus for arranging disks in a processing, cassette is described. The apparatus includes a first conveyor configured to transfer a shipping cassette containing a plurality of disks to a first position and a comb assembly configured to displace one or more of the plurality of disks from the shipping cassette in the first position. A mandrel assembly is configured to remove the one or more displaced disks from the comb assembly and a turntable assembly is configured to rotate the comb assembly and the shipping cassette from the first position to a second position. The mandrel assembly is further configured to return the one or more displaced disks to the comb assembly and the comb assembly is further configured to replace the one or more displaced disks in the shipping cassette in the second position. A second conveyor is configured to transfer a processing cassette to a load position and the mandrel assembly is further configured to remove the plurality of disks from the shipping cassette in the second position and to load the plurality of disks into the processing cassette in the load position.

According to another aspect of the present disclosure a method for arranging a plurality of disks in a processing cassette is described. The method includes displacing one or more of the plurality of disks from a shipping cassette in a first position on a first conveyor with a comb assembly, holding the one or more displaced disks from the comb assembly with a mandrel assembly, and rotating the shipping cassette from the first position to a second position on the first conveyor. The one or more displaced disks are returned from the mandrel assembly to the comb assembly and are replaced in the shipping cassette with the comb assembly. The plurality of disks are removed from the shipping cassette with the mandrel assembly and loaded into a processing cassette in a load position on a second conveyor.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components have been simplified or omitted from the figures to avoid obscuring the concepts of the subject technology.

The subject technology concerns the transfer of disks used for single-sided hard drive media from a preparation manufacturing line, where disks are prepared for sputtering, to a sputtering manufacturing line, where a thin film of magnetic material is sputtered on one side of each disk. Because only one side of each disk is used for sputtering the magnetic material, only one side of each disk needs to be prepared for sputtering. Accordingly, each disk used for single-sided hard drive media has one good side, which has been prepared for sputtering, and one bad side when the disks leave the preparation manufacturing line. The bad side of each disk may be used to handle the disk during the sputtering process.

Figure 1A:
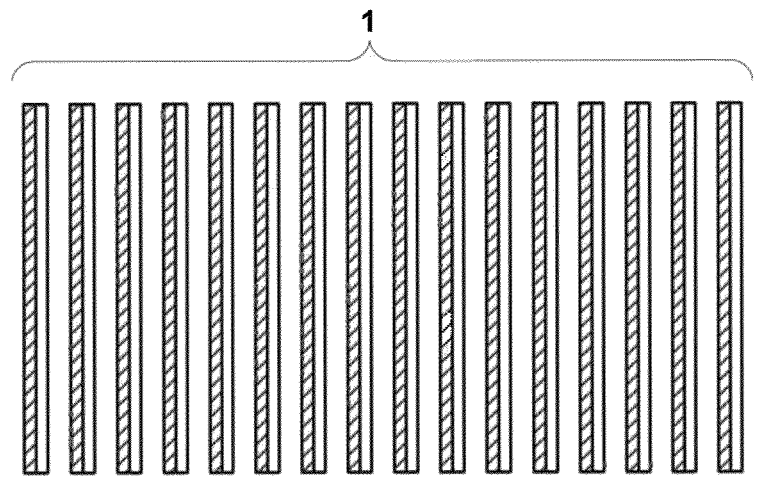
FIGS. 1A and 1B are diagrams depicting the arrangement of disks in a shipping cassette and a processing cassette, respectively.

When disks leave the preparation manufacturing line, the disks typically are arranged in a shipping cassette with a common orientation. Specifically, all of the disks in the shipping cassette are arranged with their respective good sides facing one direction and their respective bad sides facing the opposite direction. FIG. 1A is a diagram depicting the orientation of a batch of disks as they would be arranged in a shipping cassette. In FIG. 1A, each disk 1 is depicted with its bad side represented using a cross-hatch pattern and its good side represented with no pattern.

Figure 1B:
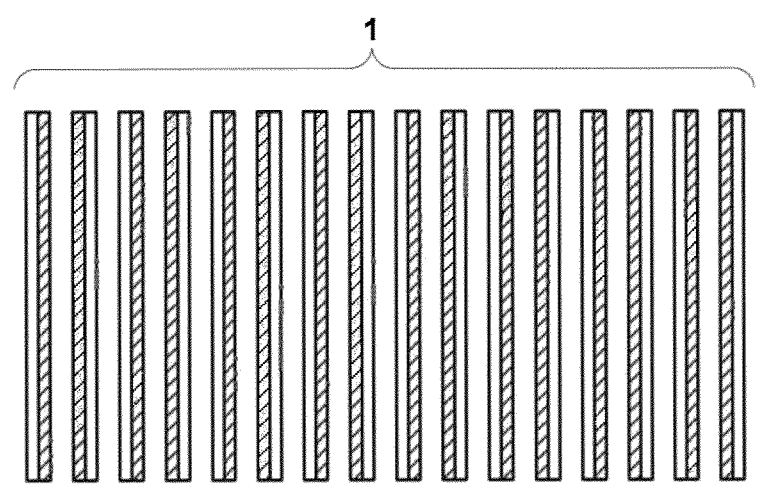

On a sputtering manufacturing line, the disks may be removed from a processing cassette in pairs for various stages of the sputtering process. To remove each pair of disks, an arm having two opposing vacuum surfaces may be positioned between the two disks and operated to temporarily adhere to the bad side of each disk thereby allowing the arm to remove the disks from the processing cassette. To facilitate this removal process, the pairs of disks must be oriented with their respective bad sides facing each other. FIG. 1B is a diagram depicting the orientation of a batch of disks as they would be arranged in the processing cassette. As depicting in FIG. 1B, each of the disks 1 in the batch is arranged with its bad side facing the bad side of an adjacent disk 1. The subject technology provides an apparatus and method for flipping the disks in a batch to change their orientation from that depicted in FIG. 1A to that depicted in FIG. 1B, and exchanging a shipping cassette containing the batch of disks for a processing cassette.

FIGS. 1A and 1B depict sixteen disks 1 in the batch. Those skilled in the art will recognize that the subject technology is not limited to batches of sixteen disks. A batch of disks arranged in shipping and processing cassettes may comprise more than sixteen disks or fewer than sixteen disks without departing from the scope of the subject technology. For example, a batch of twenty-four disks may be arranged in a single cassette.

Figure 2:
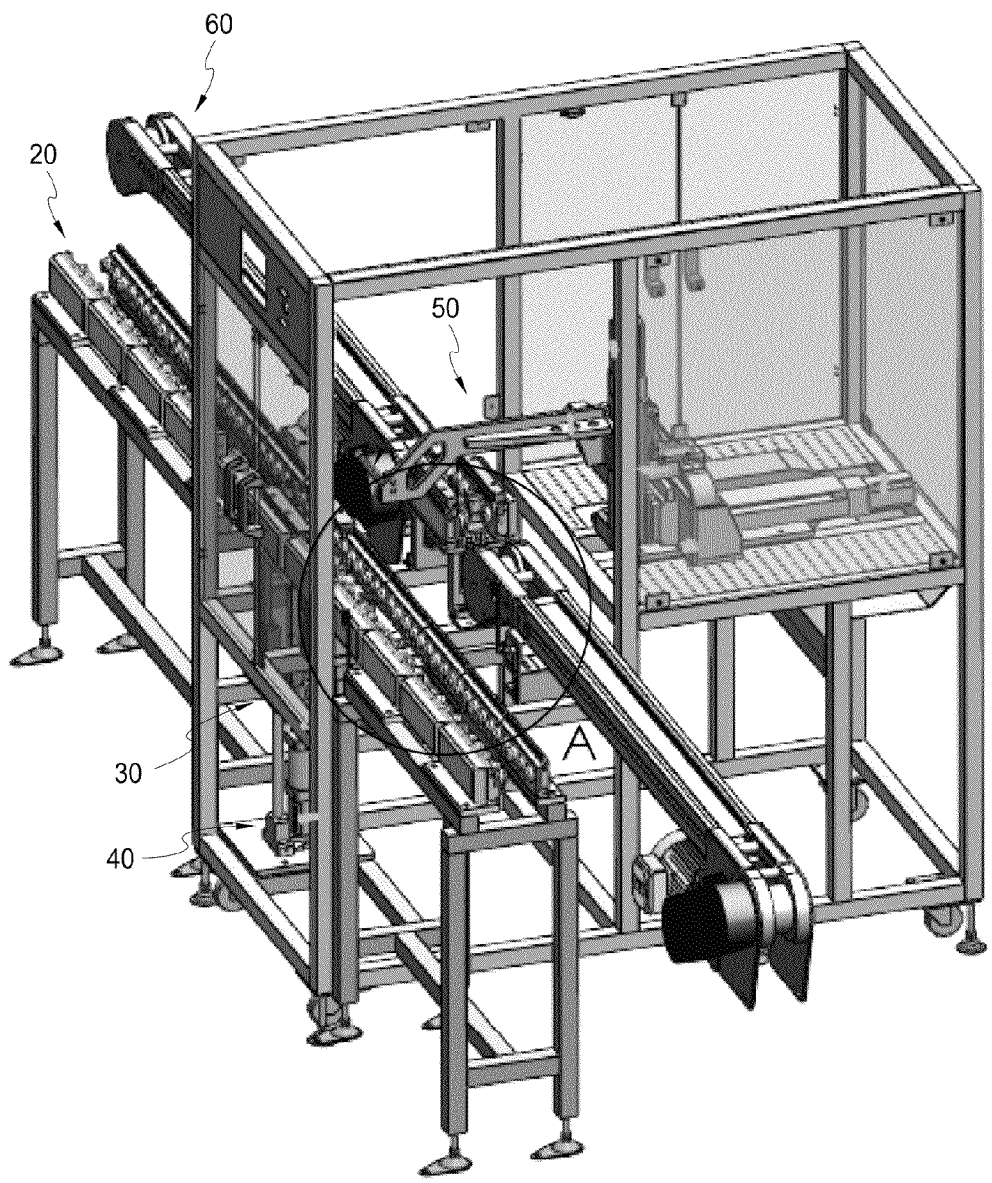
FIG. 2 is a perspective view of a flip/exchange combo machine according to one aspect of the subject technology.

FIG. 2 is a perspective view of flip/exchange combo machine 10 according to one aspect of the subject technology. Flip/exchange combo machine 10 includes five primary components: a first conveyor 20 for transferring a shipping cassette containing a batch of disks to a process area and removing the empty shipping cassette from the process area; a comb assembly 30 for displacing one or more disks from the shipping cassette; a turntable assembly 40 for rotating the shipping cassette; a mandrel assembly 50 for holding the one or more disks displaced from the shipping cassette by comb assembly 30 and for transferring the batch of disks from the shipping cassette to a processing cassette; and a second conveyor 60 for transferring an empty processing cassette to the process area and removing a loaded processing cassette from the process area. Each of these components will be described in further detail below.

As noted above, first conveyor 20 is for transferring shipping cassettes containing disks to a process area and removing empty shipping cassettes from the process area. Specifically, first conveyor 20 is configured to engage a shipping cassette mounted on a track system and drive the shipping cassette from an initial mount position to the process area and from the process area to a dismount position. The track system may comprise a series or rollers arranged along a track for supporting the shipping cassette and a drive mechanism operated to push the shipping cassette along the track from the initial mount position to the process area and from the process area to the dismount position. Conveyors are well known in the manufacturing industry and the subject technology is not limited to any particular type of conveyor. Those skilled in the art will recognize a number of different conveyors suitable for transferring shipping cassettes between desired positions.

Shipping cassettes must be mounted on first conveyor 20 oriented in the same direction. Specifically, the shipping cassettes must be mounted so that the good sides of the disks contained therein are always facing the same direction. If the shipping cassette is mounted in the opposite direction, the batch of disks contained therein may be flipped by flip/exchange combo machine 10 so that the good sides of each pair of disks face one another rather than the bad sides. To prevent the shipping cassettes from being mounted incorrectly on first conveyor 20, a sensor may be incorporated into first conveyor 20 and the shipping cassettes to sound an alarm or stop the operation of flip/exchange combo machine 10 if a shipping cassette is mounted incorrectly. The sensor may be an electrical sensor or a mechanical sensor. For example, a notch may be formed in each shipping cassette and a depressable pin may be arranged on first conveyor 20 at a location aligned with the notch when the shipping cassette is mounted on first conveyor 20. As long as the shipping cassette is mounted in the correct orientation, the notch allows the pin to remain extended. However, if the shipping cassette is mounted in the incorrect orientation, the notch does not align with the pin and the shipping cassette depresses the pin. The depressed pin may generate a signal to sound an alarm or stop operation of flip/exchange combo machine 10 until the shipping cassette is correctly oriented. Those skilled in the art will recognize other sensor systems that may be used to monitor the mounted orientation of shipping cassettes on first conveyor 20 without departing from the scope of the subject technology.

Figure 3:
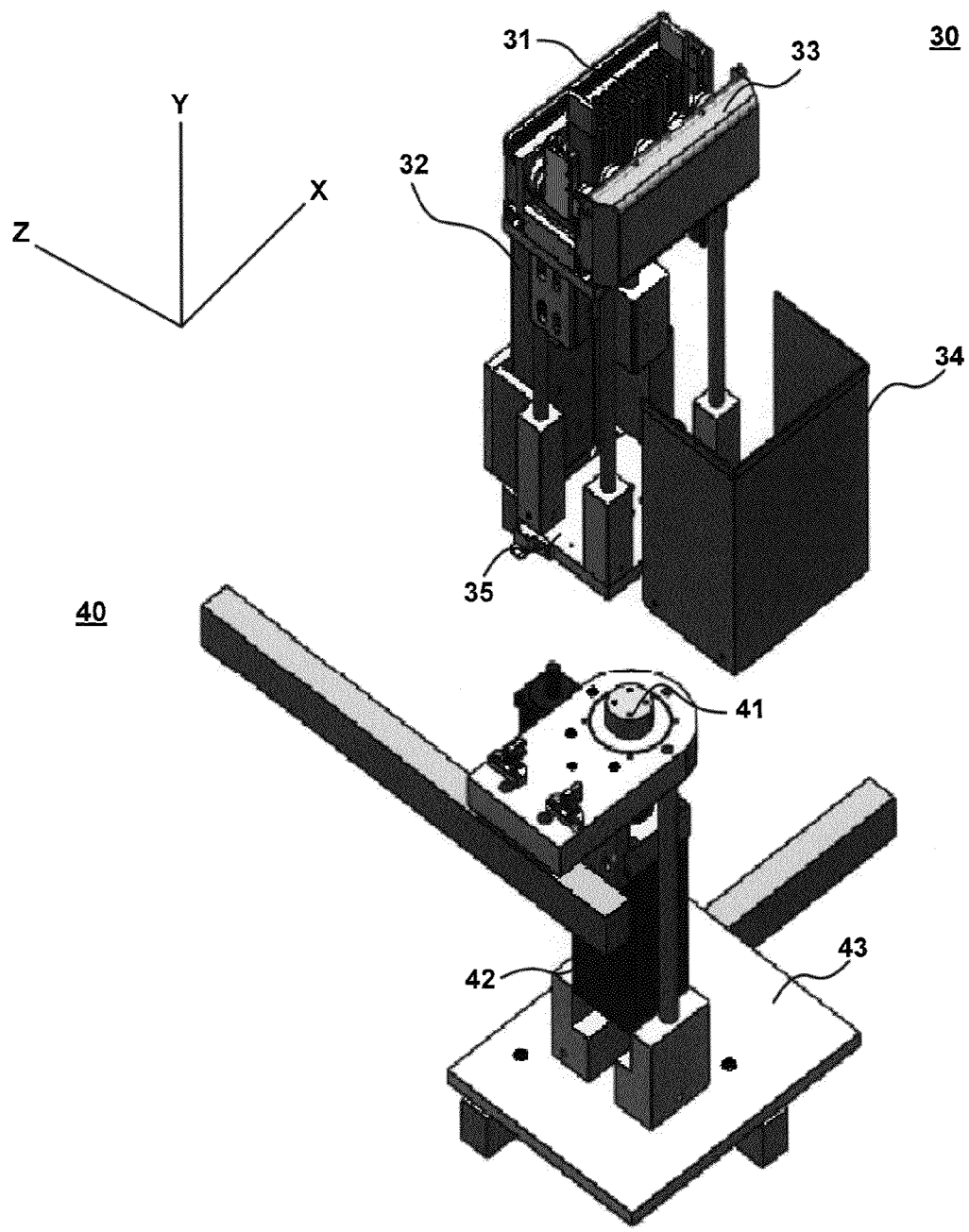
FIG. 3 is a perspective view of a comb assembly and a turntable assembly according to one aspect of the subject technology.

FIG. 3 is a perspective view of comb assembly 30 and turntable assembly 40 according to one aspect of the subject technology. Comb assembly 30 includes disk comb 31, comb actuator 32, conveyor segment 33, cover 34, and comb base 35. Turntable assembly 40 includes turntable 41, turntable motor 42 and turntable base 43. Each of these components is described in more detail below.

Figure 4A:
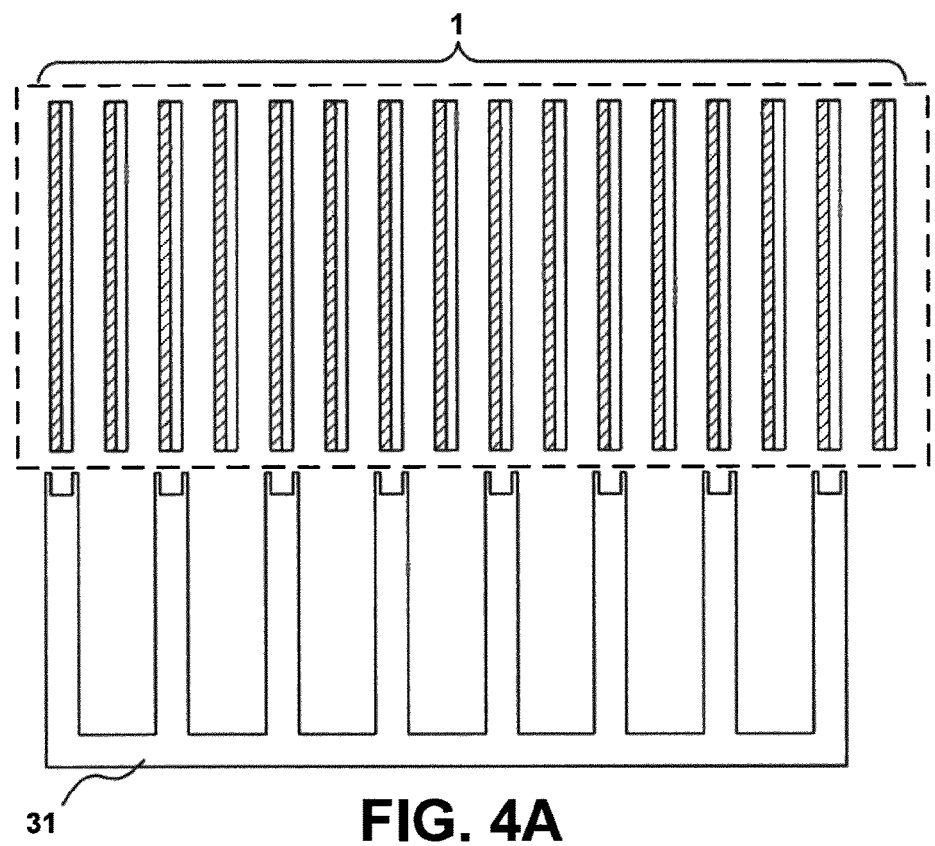
FIGS. 4A-4L are diagrams depicting the arrangement of a disk comb with respect to disk contained within a shipping cassette according to one aspect of the subject technology.

Turning initially to comb assembly 30, disk comb 31 includes multiple teeth each designed to support a respective disk. According to one aspect of the subject technology, the teeth of disk comb 31 are spaced apart from one another so as to align with alternating disk slots in a shipping cassette. With this arrangement, disk comb 31 may be referred to as a double-spaced comb. The distal end of each tooth of disk comb 31 includes a support structure configured to support a disk contained in a shipping cassette as the disk is displaced from the shipping cassette. FIG. 4A is a diagram depicting disk comb 31 aligned with a batch of disks contained in a shipping cassette. The perimeter of the shipping cassette is represented in FIG. 4A using dashed lines (the shipping cassette is later identified as reference numeral 65 in FIGS. 4J-L and FIG. 7). As depicted in FIG. 4A, disk comb 31 is a double-spaced comb and includes one tooth aligned with every other disk contained within the shipping cassette.

Figure 4B:
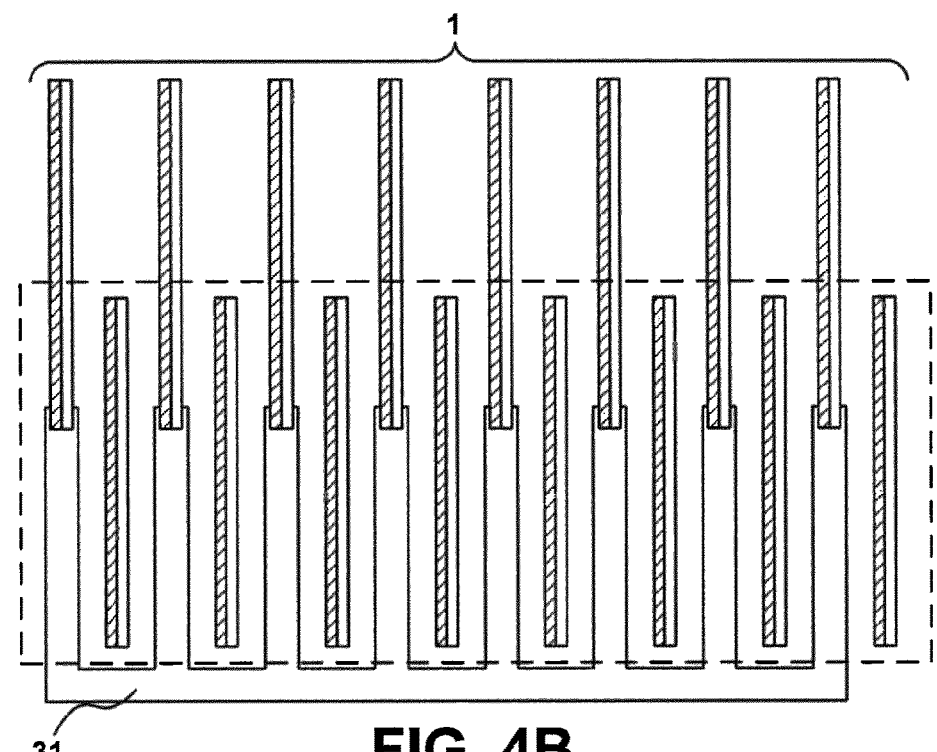

Returning to FIG. 3, disk comb 31 is attached to comb actuator 32. Comb actuator 32 is mounted to comb base 35 and is partially enclosed by cover 34. Comb actuator 32 is operable to position disk comb 31 along the y-axis represented in FIG. 3. In this manner, comb assembly 30 is configured to displace one or more disks contained in a shipping cassette by actuating comb actuator 32 to position disk comb 31 along the y-axis. FIG. 4B is a diagram illustrating disk comb 31 supporting multiple disks 1 displaced from a shipping cassette, which is again represented using dashed lines. Comparing FIGS. 4A and 4B, FIG. 4A depicts disk comb 31 in a lowered position of comb actuator 32 while FIG. 4B depicts disk comb 31 in a raised position of comb actuator 32. As represented in FIG. 4B, the disks displaced by disk comb 31 extend above the disks contained in the shipping cassette that are not aligned with a tooth of disk comb 31 and may extend beyond the perimeter of the shipping cassette. FIGS. 4C-L will be fully described in conjunction with the process represented in FIG. 6.

FIGS. 4A and 4B depict a batch of sixteen disks arranged in a shipping cassette, with eight of the disks being displaced by disk comb 31. As noted above, a shipping cassette may contain more or less than sixteen disks and correspondingly disk comb 31 may displace more or less than eight disks in the shipping cassette. For example, a shipping cassette may contain twenty-four disks of which twelve are displaced by disk comb 31.

Comb assembly 30 further includes conveyor segment 33. Conveyor segment 33 is configured to be positioned within and aligned with first conveyor 20. Conveyor segment 33 may include a track system compatible with that of first conveyor 20 and allow the drive mechanism of first conveyor 20 to push a shipping cassette onto and through conveyor segment 33. Within flip/exchange combo machine 10, conveyor segment 33 is arranged in the process area.

As depicted in FIG. 3, disk comb 31 and comb actuator 32 are arranged to align disk comb 31 within conveyor segment 33 so that disk comb 31 can pass through a portion of conveyor segment 33 when raised by comb actuator 32. Furthermore, disk comb 31 is arranged within conveyor segment 33 to be aligned with a shipping cassette when it is positioned on conveyor segment 33 to align the teeth of disk comb 31 with one or more disks contained within the shipping cassette to be displaced in the manner represented in FIG. 4B.

With respect to turntable assembly 40, turntable 41 is mounted to a spindle of turntable motor 42, which is, mounted to turntable base 43. Comb base 35 of comb assembly 30 is mounted to turntable 41. As turntable motor 42 is driven, turntable 41 and comb assembly 30 are rotated about an axis parallel with the y-axis represented in FIG. 3. In this manner, a shipping cassette positioned on conveyor segment 33 of comb assembly 30 can be rotated (e.g., 180°) from a first position to a second position. The subject technology is not limited to any particular type of motor. For example, turntable motor 42 may be a stepper motor. Alternatively, turntable motor 42 may be replaced with some other type of actuator capable of rotating turntable 41 from a first position to a second position without departing from the scope of the subject technology.

Figure 4C:
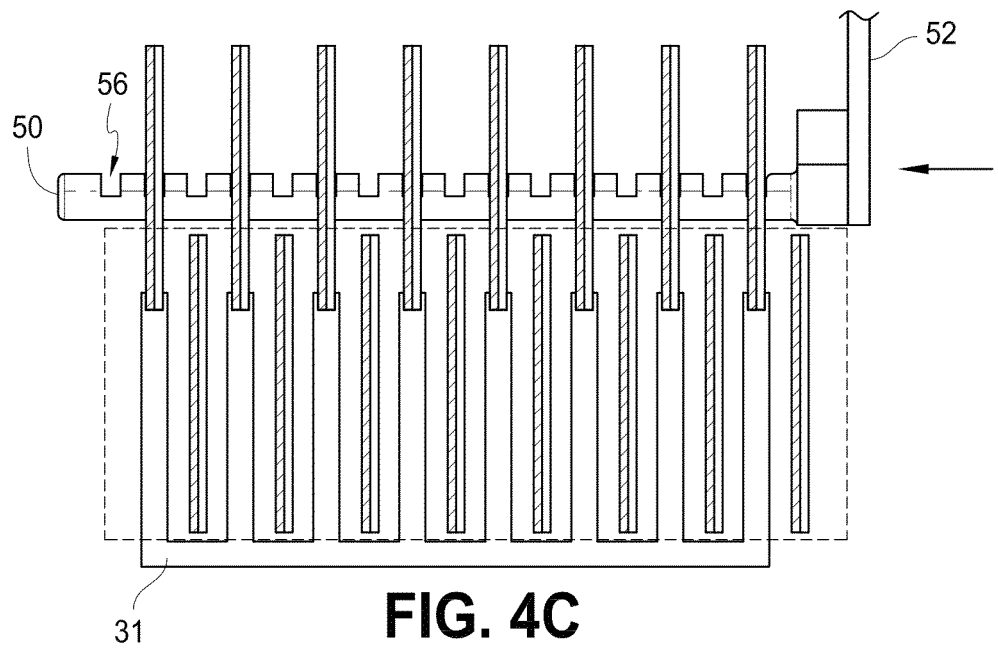
Figure 4D:
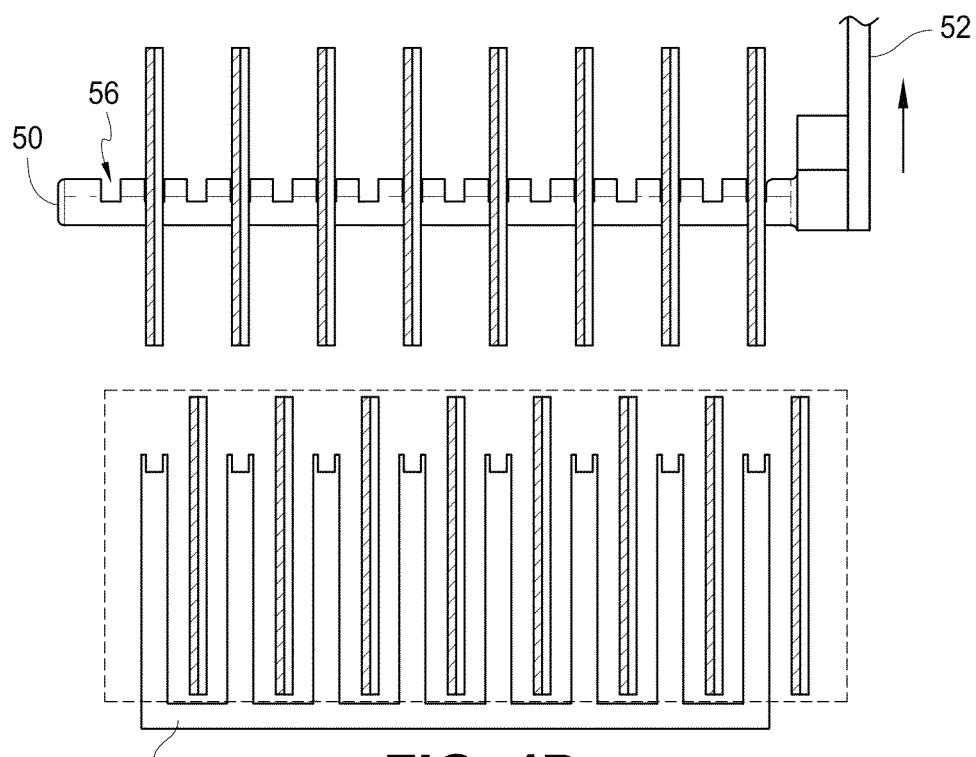
Figure 4E:
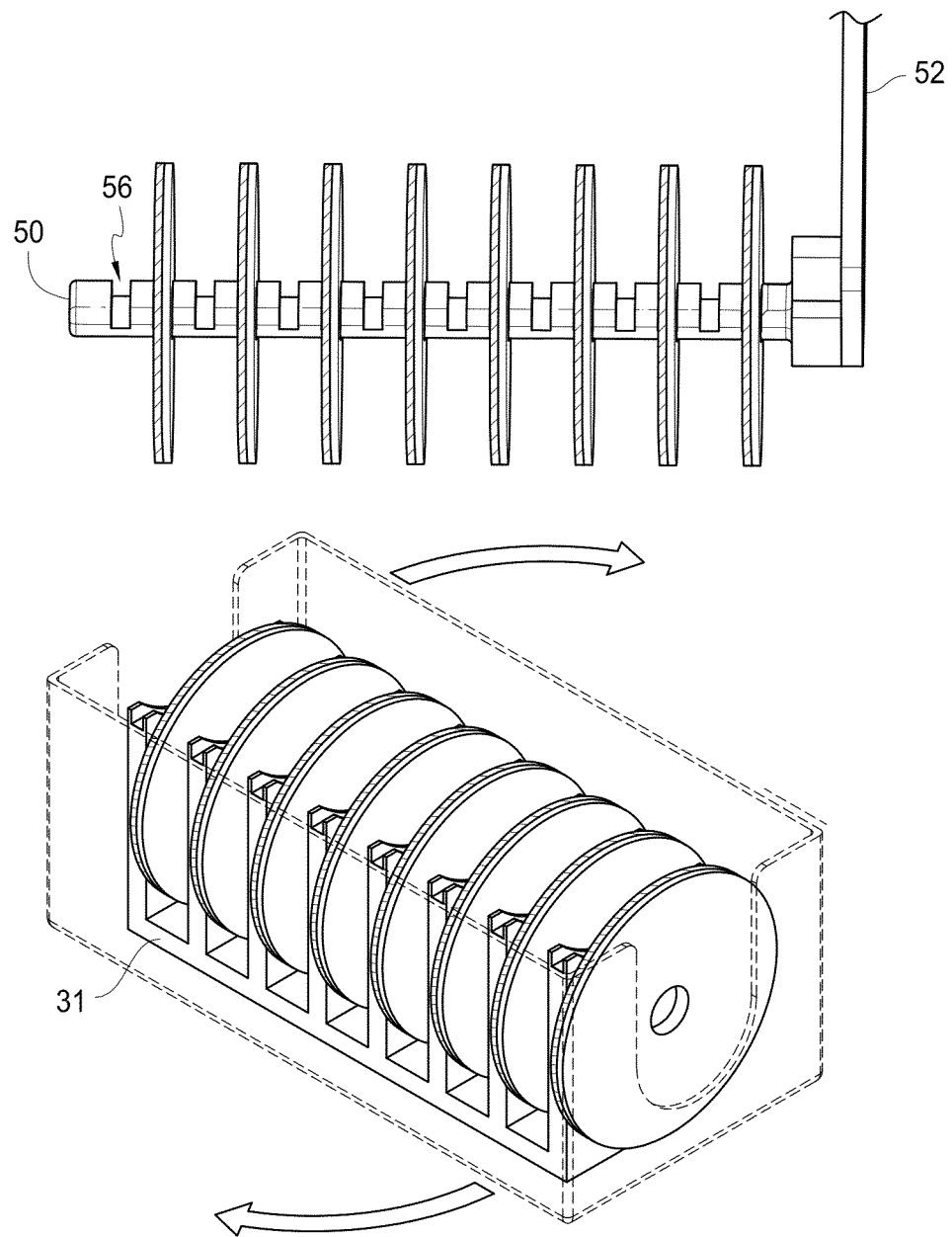
Figure 4F:
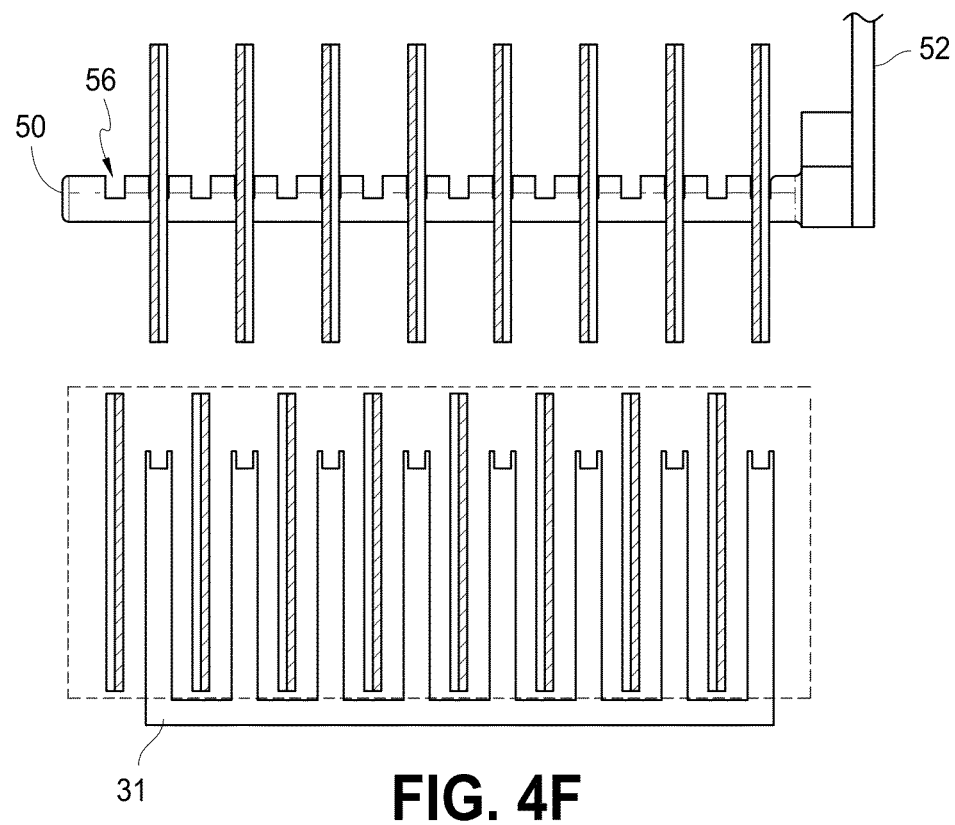
Figure 4G:
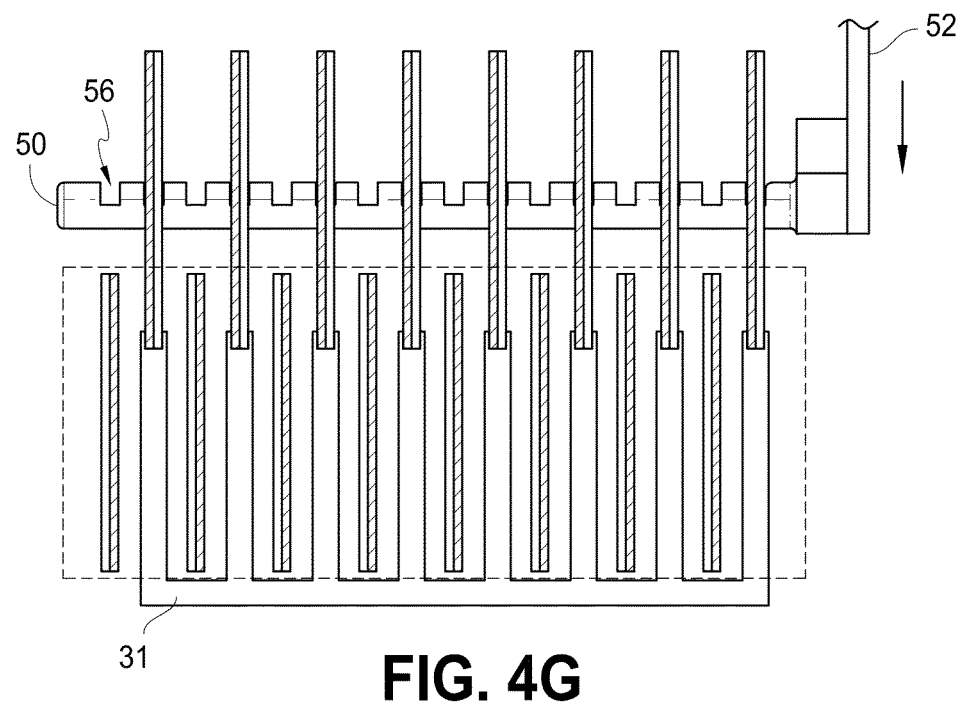
Figure 4I:
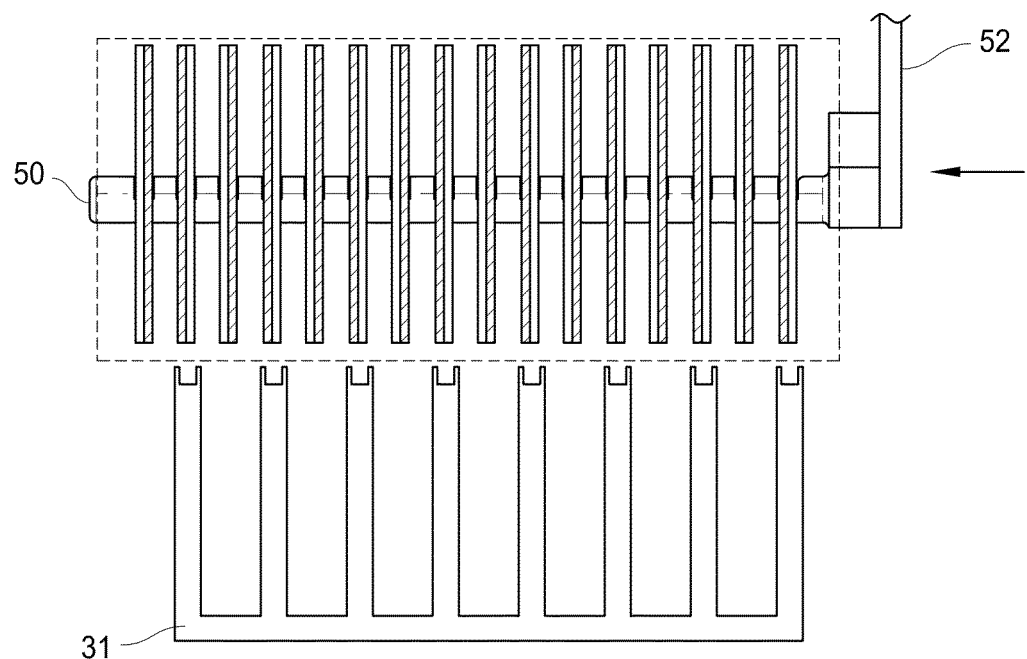
Figure 4K:
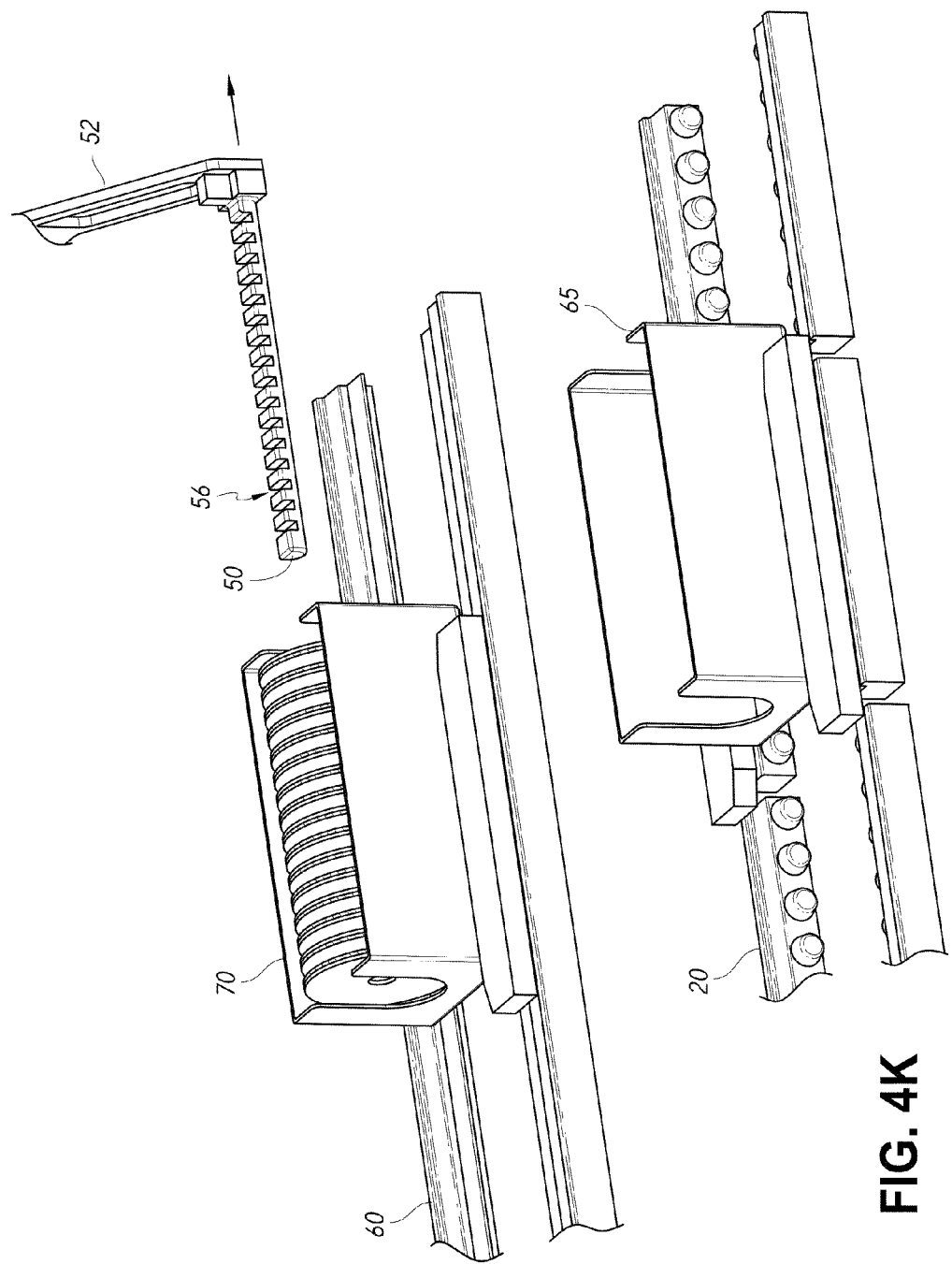
Figure 5:
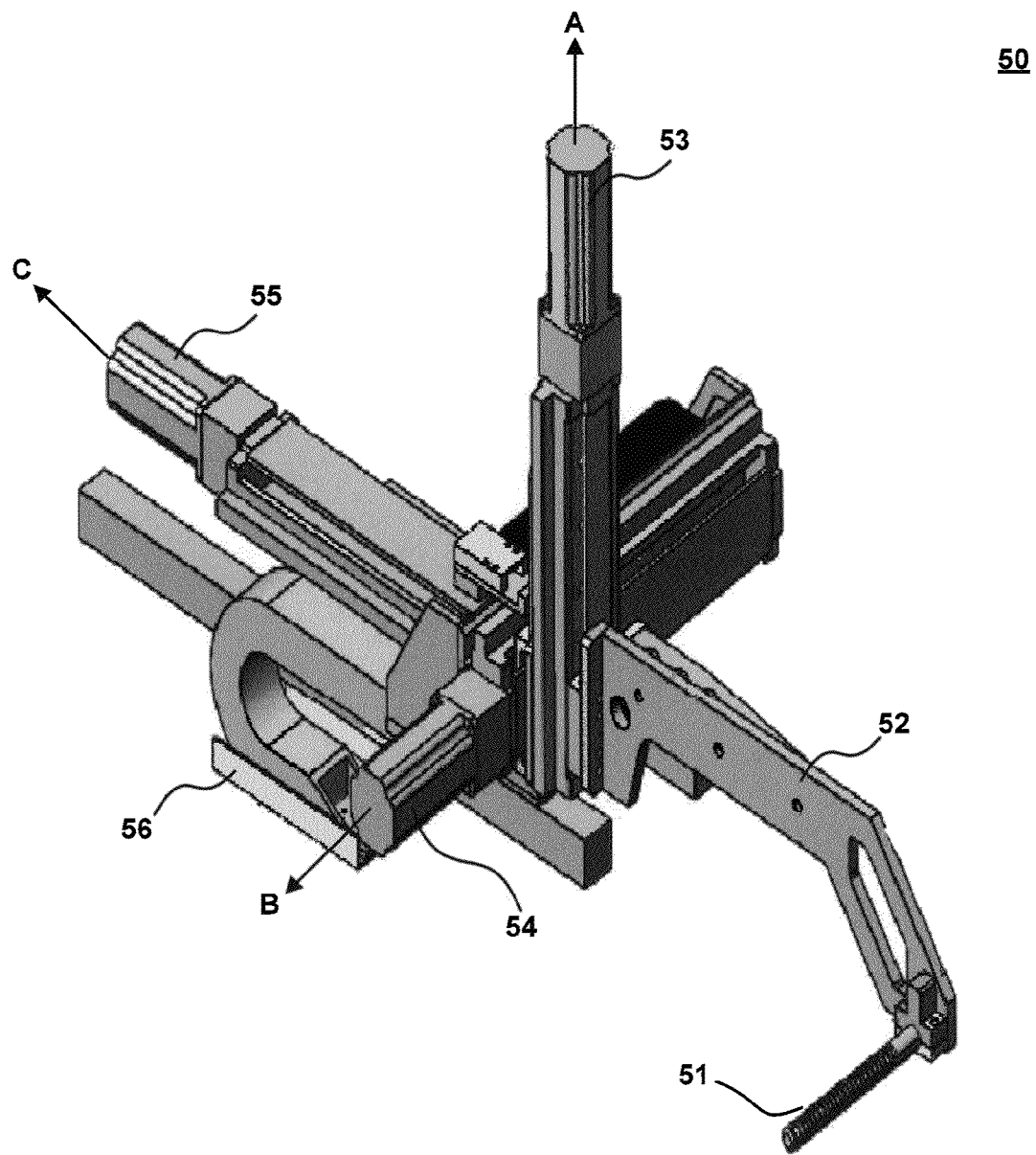
FIG. 5 is a perspective view of a mandrel assembly according to one aspect of the subject technology.

FIG. 5 is a perspective view of mandrel assembly 50 according to one aspect of the subject technology. Mandrel assembly 50 includes a mandrel 51, a support arm 52, three actuators 53, 54, and 55, and a mandrel base 56. Hard drive media disks have a central circular opening for mounting the media to a servo motor within a hard drive. Mandrel 51 has a diameter small enough to allow mandrel 51 to pass through the central circular opening of the disks. Mandrel 51 is further configured to have multiple teeth (also shown as reference numeral 56 in FIGS. 4C-G, 4I and 4K) arranged to align with the spacing of the disks contained in a shipping cassette and a processing cassette. Mandrel 51 is further configured to have length approximately equal to the length of shipping cassette or the processing cassette. Accordingly, the configuration of mandrel 51 allows mandrel 51 to pass through the central openings of each disk contained within a shipping cassette or a processing cassette with the teeth of mandrel 51 arranged to capture and maintain the relative positions of the disks.

Mandrel 51 is mounted on support arm 52, which is mounted to first actuator 53. First actuator 53 is configured to position support arm 52 and mandrel 51 along the A-axis represented in FIG. 5. First actuator 53 is mounted to second actuator 54. Second actuator 54 is configured to position first actuator 53, support arm 52 and mandrel 51 along the B-axis represented in FIG. 5. Second actuator 54 is mounted to third actuator 55. Third actuator 55 is configured to position second actuator 54, first actuator 53, support arm 52 and mandrel 51 along the C-axis represented in FIG. 5. Finally, third actuator 55 is mounted to mandrel base 56.

Mandrel assembly 50 is arranged within flip/exchange combo machine 10 to align the A, B and C-axes of mandrel assembly 50 with other components of flip/exchange combo machine 10. For example, the A-axis of first actuator 53 may be arranged parallel to the y-axis of comb actuator 32. The B-axis of second actuator 54 may be arranged parallel to the direction of travel of a shipping cassette along first conveyor 20 and the direction of travel of a processing cassette along second conveyor 60. It is further noted that mandrel 51 is aligned in parallel with the B-axis of second actuator 54. Finally, the C-axis of third actuator 55 is arranged perpendicular to the A and B-axes.

As noted above, second conveyor 60 is for transferring empty processing cassettes to the process area and removing loaded processing cassettes from the process area. Specifically, second conveyor 60 is configured to engage an empty processing cassette mounted on a track system and drive the processing cassette from an initial mount position to the process area and from the process area to a dismount position. Similar to first conveyor 20, the track system may comprise a series or rollers arranged along a track for supporting the processing cassette and a drive mechanism driven to push the processing cassette along the track from an initial mount position to the process area and from the process area to a dismount position. Conveyors are well known in the manufacturing industry and the subject technology is not limited to any particular type of conveyor. Those skilled in the art will recognize a number of different conveyors suitable for transferring shipping cassettes between desired positions. It is further noted that first conveyor 20 and second conveyor 60 may be the same type of conveyor or may be different types of conveyors without departing from the scope of the subject technology.

Figure 6:
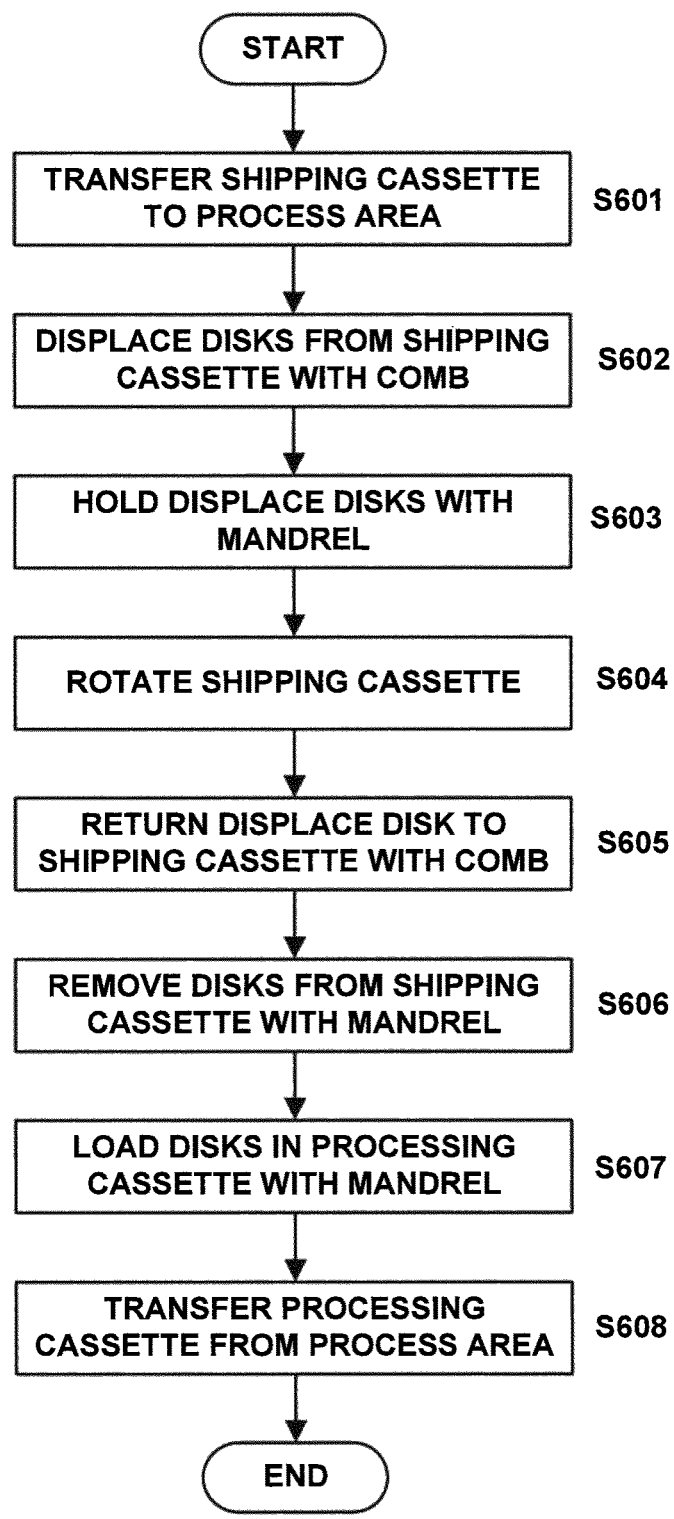
FIG. 6 is a flowchart containing steps of a method for arranging and transferring disks from a shipping cassette to a processing cassette according to one aspect of the subject technology.
Figure 7:
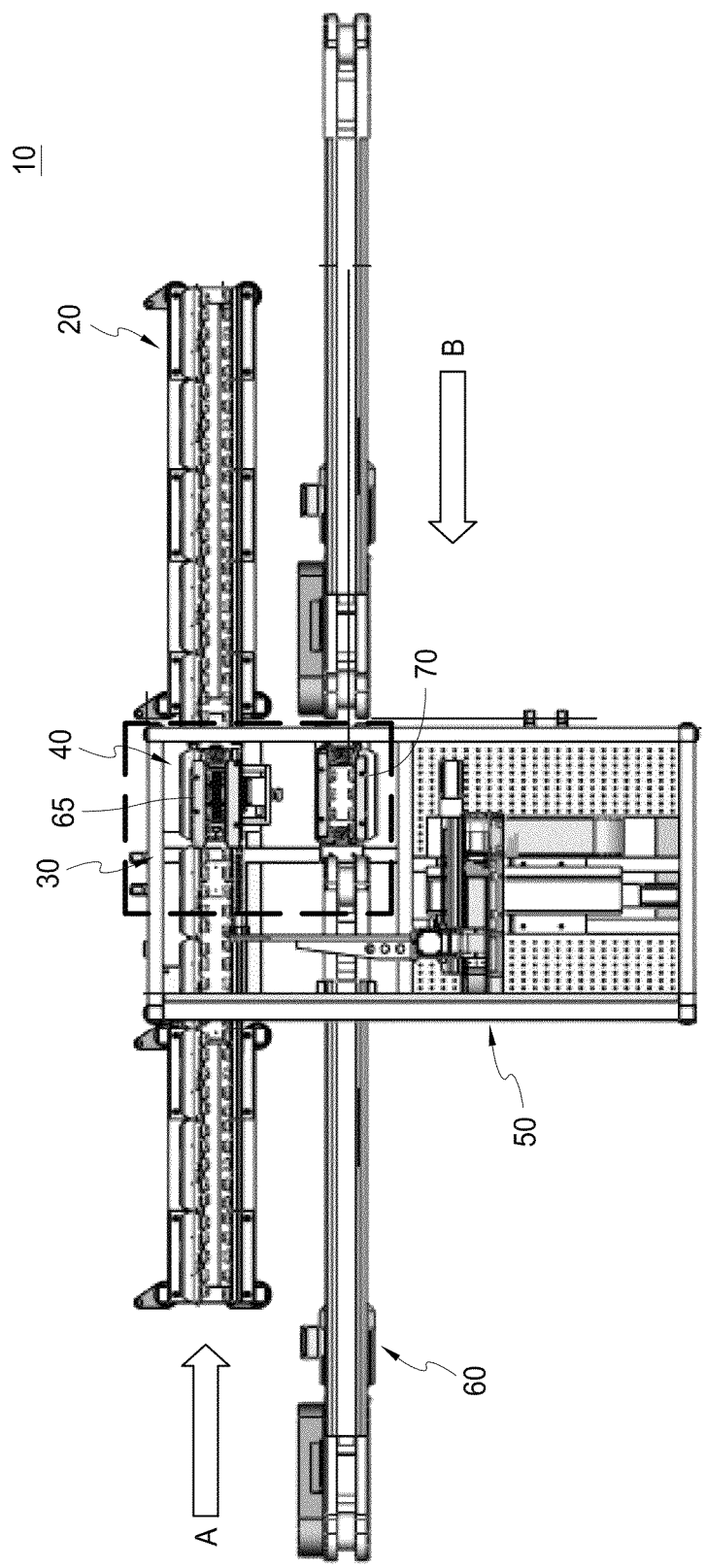
FIG. 7 is a top view of a flip/exchange combo machine according to one aspect of the subject technology.

The operation of flip/exchange combo machine 10 will now be described with reference to FIGS. 6 and 7. FIG. 6 is a flowchart depicting steps of a process for arranging and transferring a batch of disks from a shipping cassette to a processing cassette according to one aspect of the subject technology. FIG. 7 is a top view of flip/exchange combo machine 10 according to one aspect of the subject technology.

Briefly, the process represented in FIG. 6 includes transferring as shipping cassette containing a batch of disks to a process area with first conveyor 20, displacing one or more disks from the shipping cassette with comb assembly 30, holding the displaced disk with mandrel assembly 50, rotating the shipping cassette with turntable assembly 40, returning the displaced disks to the shipping cassette with comb assembly 30, loading the disks from the shipping cassette to a processing cassette with mandrel assembly 50, and transferring the processing cassette from the process area with second conveyor 60. Each of these steps will be described in more detail below.

The process represented in FIG. 6 begins once a shipping cassette containing a batch of disks is mounted on first conveyor 20. To mount the shipping cassette on first conveyor 20, a lid on the shipping cassette must be removed to allow the disks contained therein to be removed from the shipping cassette and an access panel on the bottom of the shipping cassette must be removed to allow access to disk comb 31 in the manner described above. Similarly, a processing cassette must be mounted on second conveyor 60. The processing cassette must be open to allow disks to be loaded therein. Accordingly, any lids that may be present on the processing cassette must be removed. Depending on the size of first conveyor 20 and second conveyor 60, more than one shipping cassette and more than one processing cassette may be mounted to allow the cassettes to be processed sequentially. With reference to FIG. 7, the shipping cassette is loaded on the end of first conveyor 20 near the directional arrow A and the processing cassette is loaded on the end of second conveyor 60 on the end near the directional arrow B.

In step S601, the shipping cassette 65 containing the batch of disks is transferred to a process area of flip/exchange combo machine 10 in the direction indicated by the arrow A in FIG. 7. This is also shown in FIG. 4A. The process area is represented in FIG. 7 with the box of dashed lines. The process area for the shipping cassette 65 corresponds to conveyor segment 33 of comb assembly 30. As discussed above, a sensor may be used to determine if a shipping cassette 65 has been mounted correctly on first conveyor 20. This sensor may be arranged at a portion of first conveyor 20 where the shipping cassette 65 is initially mounted. Alternatively, the sensor may be arranged within conveyor segment 33 to check the orientation of the shipping cassette 65 in the process area.

In step S602, one or more of the disks contained in the shipping cassette 65 are displaced by comb assembly 30. This is also shown in FIG. 4B. More particularly, comb actuator 32 is operated to raise disk comb 31 through conveyor segment 33 and into the shipping cassette 65 where the teeth of disk comb 31 displace the disks aligned with the teeth in the manner described above. According to one aspect of the subject technology, disk comb 31 is a double-spaced comb that displaces every other disk contained within the shipping cassette 65.

In step S603, mandrel assembly 50 is operated to hold the disks displaced by comb assembly 30. This is also shown in FIGS. 4C and 4D. More particularly, actuators 53, 54 and 55 are operated to position mandrel 51 through the central openings of each of the displaced disks. Once mandrel 51 is positioned in this manner, comb actuator 32 is operated to lower disk comb 31 away from the displaced disks held by mandrel 51. As indicated above, mandrel 51 is configured with teeth 56 to hold the displaced disks in their relative positions.

In step S604, turntable assembly 40 rotates the shipping cassette 65. This is also shown in FIG. 4E. More particularly, turntable motor 42 is operated to rotate turntable 41, together with comb assembly 30 attached thereto, 180°. Mandrel assembly 50 may operate first actuator 53 to elevate the displaced disks held by mandrel 51 to avoid obstructing the rotation of the shipping cassette 65 on comb assembly 30. By rotating the shipping cassette 65 180°, the displaced disks are now oriented in the opposite direction as the disks remaining in the shipping cassette 65. This is also shown in FIG. 4F.

Figure 4H:
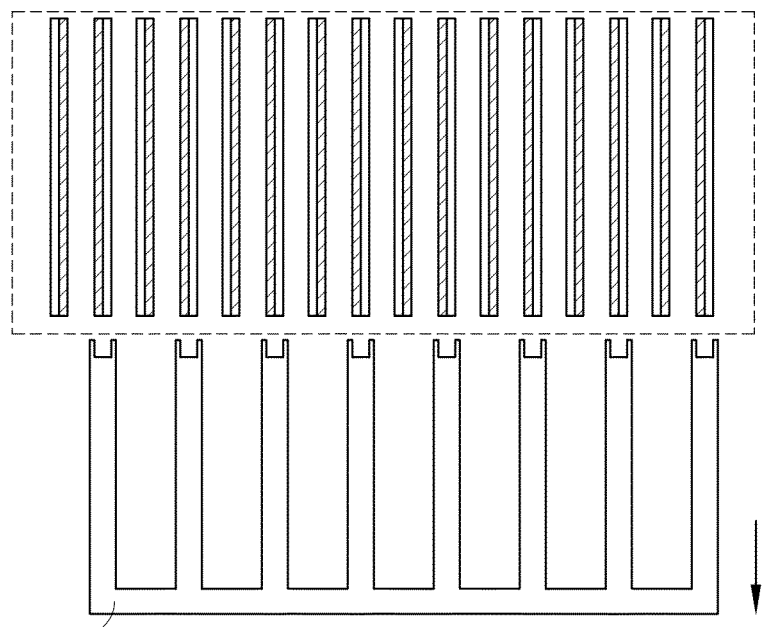

In step S605, the displaced disks are returned to the shipping cassette 65 by the mandrel assembly 50 and the comb assembly 30. This is also shown in FIG. 4G. More particularly, comb actuator 32 is operated to raise disk comb 31 up through conveyor segment 33 and into the shipping cassette 65. If mandrel 51 was elevated, first actuator 53 is operated to lower mandrel 51 so that the displaced disks are supported by the teeth of disk comb 31. Mandrel assembly 50 is then operated to withdraw mandrel 51 from within the central openings of the disks. Once mandrel 51 has cleared the displaced disks, comb actuator 32 is operated to lower disk comb 31 and the displaced disks supported thereon back into the shipping cassette 65. This is also shown in FIG. 4H. The batch of disks in the shipping cassette 65 are now arranged with the bad sides of each pair of disks facing each other, as depicted in FIG. 1B.

Figure 4J:
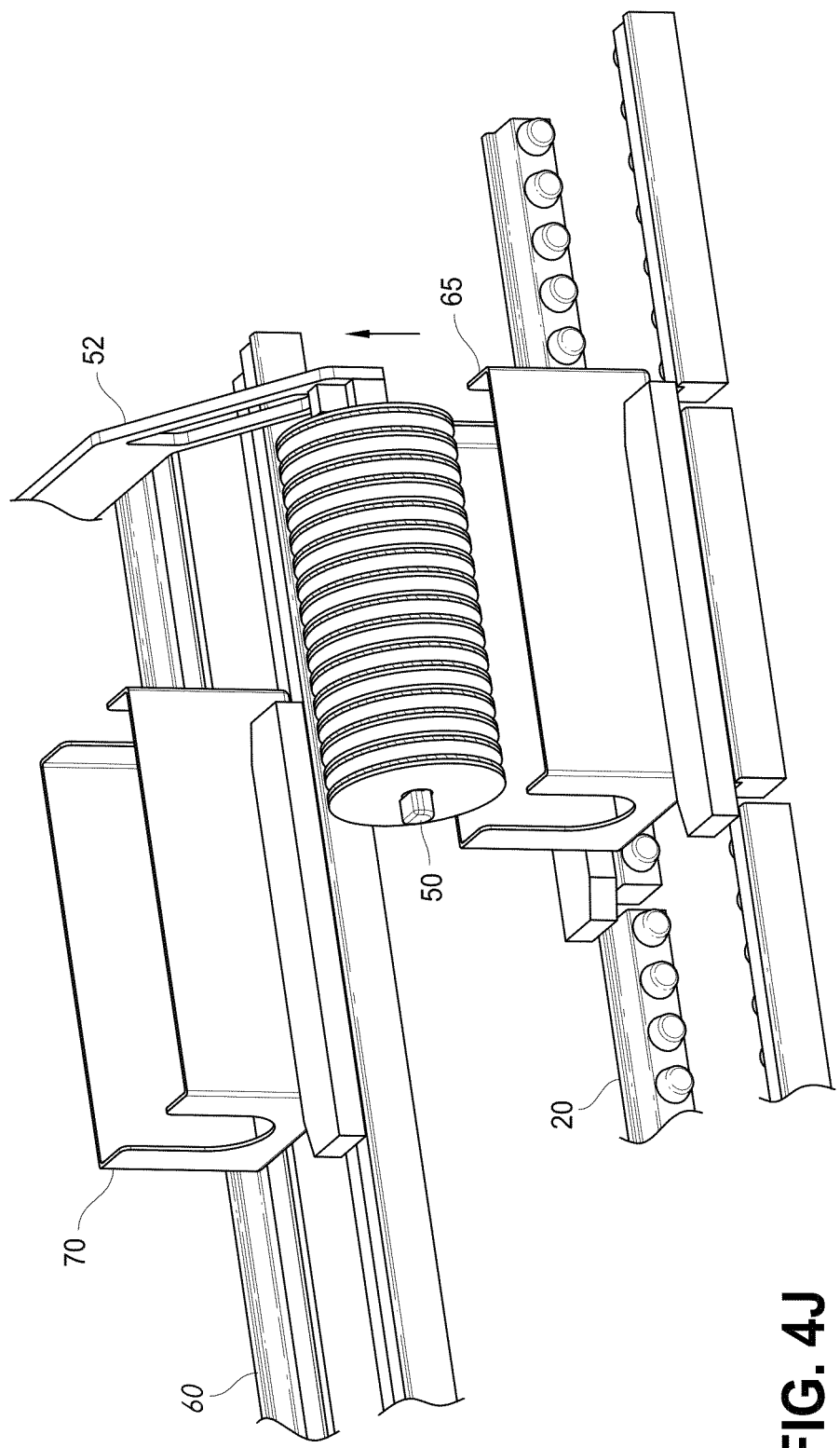

In step S606, mandrel assembly 50 is operated to position mandrel 51 within the central openings of all of the disks contained in the shipping cassette 65. This is also shown in FIG. 4I. Mandrel assembly 50 then elevates mandrel 51 to remove the entire batch of disks from the shipping cassette 65. This is also shown in FIG. 4J.

Figure 4L:
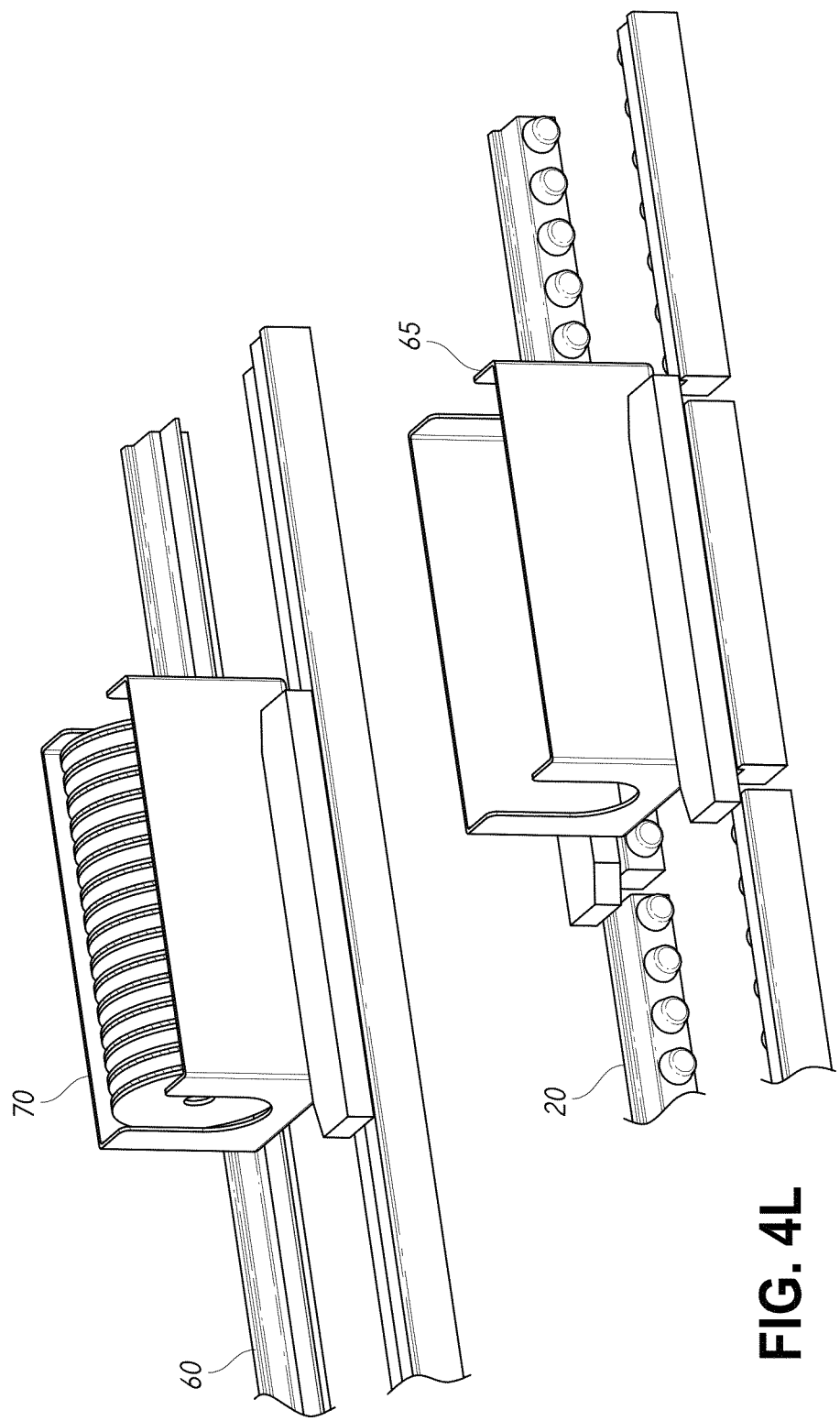

In step S607, mandrel assembly 50 is operated to load the disks in a processing cassette 70, which has been transferred to the process area by second conveyor 60. This is also shown in FIG. 4K. More particularly, actuators 53, 54, and 54 are operated to move mandrel 51, together with the batch of disks held thereon, from the shipping cassette 65 on first conveyor 20 in the process area to the processing cassette 70 on second conveyor 60 in the process area and lower the batch of disks into the processing cassette 70. After the disks have been lowered into the processing cassette 70, mandrel assembly 50 is operated to withdraw mandrel 51 from the central openings of the disks. This is also shown in FIG. 4L.

In step S608, the processing cassette 70 containing the batch of disks oriented in the manner depicted in FIG. 1B is transferred from the processing area by second conveyor 60 in the directed represented by arrow B in FIG. 7. The process represented in FIG. 6 may be repeated for each shipping cassette 65 mounted on first conveyor 20 and corresponding processing cassette 70 mounted on second conveyor 60.

Flip/exchange combo machine 10 also may be used to transfer disks from a shipping cassette 65 to a processing cassette without rearranging the disks. For example, in the process represented in FIG. 6, steps S602 through S605 may be skipped when the disks do not need to be rearranged. This sub-process may be used, for example, when transferring doubled sided media disks from a shipping cassette 65 to a processing cassette 70.

The process represented in FIG. 6 may be controlled by one or more controllers. For example, first conveyor 20, comb assembly 30, turntable assembly 40, mandrel assembly 50, and second conveyor 60 may be in communication with one or more controllers. The one or more controllers may communicate data and commands with each of these components according to code executed by one or more processors within the one or more controllers. The data communicated with the components may include status and position information for the different components. The commands communicated with the components may include operational commands for the different components to perform the operations discussed above with respect to FIG. 6. The data and commands may be communicated using both wired and wireless interfaces and protocols. The code may be stored in machine readable media, such as electrical media (e.g., RAM, Flash, EEPROM, etc.), optical media (e.g., CD-ROM, DVD, etc.), and/or magnetic media (e.g., hard drive, magnetic tape, floppy disk, etc.).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An apparatus for arranging disks in a processing cassette, comprising:
    a first conveyor configured to transfer a shipping cassette containing a plurality of disks to a first position;
    a comb assembly positioned within an aperture of the first conveyor, the comb assembly configured to displace one or more of the plurality of disks from the shipping cassette in the first position;
    a mandrel assembly configured to remove the one or more displaced disks from the comb assembly;
    a turntable assembly configured to rotate the comb assembly and the shipping cassette from the first position to a second position,
    wherein the mandrel assembly is further configured to return the one or more displaced disks to the comb assembly and the comb assembly is further configured to replace the one or more displaced disks in the shipping cassette in the second position; and
    a second conveyor configured to transfer a processing cassette to a load position,
    wherein the mandrel assembly is further configured to remove the plurality of disks from the shipping cassette in the second position and to load the plurality of disks into the processing cassette in the load position.

2. The apparatus according to claim 1, wherein the comb assembly comprises a disk comb having teeth corresponding to alternating slots in the shipping cassette for holding the plurality of disks, and an actuator configured to raise the disk comb to displace the one or more disks from the shipping cassette.

3. The apparatus according to claim 1, wherein the turntable assembly comprises:
    a turntable; and
    a motor configured to rotate the turntable from the first position to the second position,
    wherein the comb assembly is mounted to the turntable.

4. The apparatus according to claim 3, wherein the second position of the shipping cassette is rotated 180° from the first position of the shipping cassette.

5. The apparatus according to claim 1, wherein the mandrel assembly comprises a mandrel having a plurality of teeth arranged to hold the one or more displaced disks removed from the comb assembly in their relative positions and the plurality of disks removed from the shipping cassette in their relative positions.

6. The apparatus according to claim 5, wherein the mandrel assembly further comprises a first actuator configured to move the mandrel along a first axis, a second actuator configured to move the mandrel along a second axis, and a third actuator configured to move the mandrel along a third axis, wherein the first axis is perpendicular to an upper surface of the first conveyor, the second axis is perpendicular to the first axis and parallel to a direction of travel on the first conveyor, and the third axis is perpendicular to both the first and second axes.

7. The apparatus according to claim 1, wherein the first and second conveyors are roller conveyors.

8. The apparatus according to claim 1, further comprising a controller configured to control operation of the comb assembly, the mandrel assembly and the turntable assembly.

9. The apparatus according to claim 1, further comprising a sensor arranged on the first conveyor to detect an orientation of the shipping cassette.

10. The apparatus according to claim 1, wherein the comb assembly includes a conveyor segment that is positioned and aligned with the first conveyor, further wherein the first conveyor and the comb assembly include a track system capable of moving the shipping cassette.

11. A method for arranging a plurality of disks in a processing cassette, the method comprising:
    displacing every other disk of the plurality of disks from a shipping cassette in a first position on a first conveyor with a comb assembly;
    holding the every other disk from the comb assembly with a mandrel assembly;
    rotating the shipping cassette from the first position to a second position on the first conveyor;
    replacing the every other disk in the shipping cassette with the comb assembly from the mandrel assembly;
    removing the plurality of disks from the shipping cassette with the mandrel assembly; and
    loading the plurality of disks into a processing cassette in a load position on a second conveyor.

12. The method according to claim 11, further comprising transferring the shipping cassette to the first position on the first conveyor.

13. The method according to claim 11, further comprising transferring the processing cassette to the load position on the second conveyor.

14. The method according to claim 11, wherein the second position of the shipping cassette is rotated 180° from the first position of the shipping cassette.

15. The method according to claim 11, further comprising detecting an orientation of the shipping cassette on the first conveyor.

16. A method for arranging disks prior to material deposition in magnetic media fabrication, the method comprising:
receiving a plurality of disks in a shipping cassette on a first conveyor, wherein each disk in the plurality of disks includes a fabrication surface and a non-fabrication surface opposite the fabrication surface;
positioning a comb assembly to displace every other disk in the plurality of disks from the shipping cassette from a first position in contact with the shipping cassette to a second position not in contact with the shipping cassette;
positioning a mandrel assembly to pick up the every other disk from the comb assembly;
rotating the shipping cassette from the first position to a second position on the first conveyor;
positioning the mandrel assembly to replace the every other disk into the shipping cassette with the comb assembly;
removing the plurality of disks from the shipping cassette with the mandrel assembly; and
loading the plurality of disks into a processing cassette in a load position on a second conveyor.

17. The method according to claim 16, wherein prior to displacing every other disk in the shipping cassette, each fabrication surface of the plurality of disks faces a first direction and, subsequent to replacing the every other disk, the fabrication surfaces of the plurality of disks alternately face the first direction and a second direction.

18. The method according to claim 16, wherein the second position of the shipping cassette is rotated 180° so that the plurality of disks in the shipping cassette are orientated in the opposite direction to the every other disk on the mandrel.

19. The method according to claim 16, wherein after replacing the every other disk into the shipping cassette with the comb assembly, the fabrication surface of the plurality of disks in the shipping cassette that were not displaced faces the fabrication surface of the every other disk.

20. The method according to claim 16, wherein the comb assembly is positioned within an aperture of the first conveyor.

* * * * *